Figure 1:
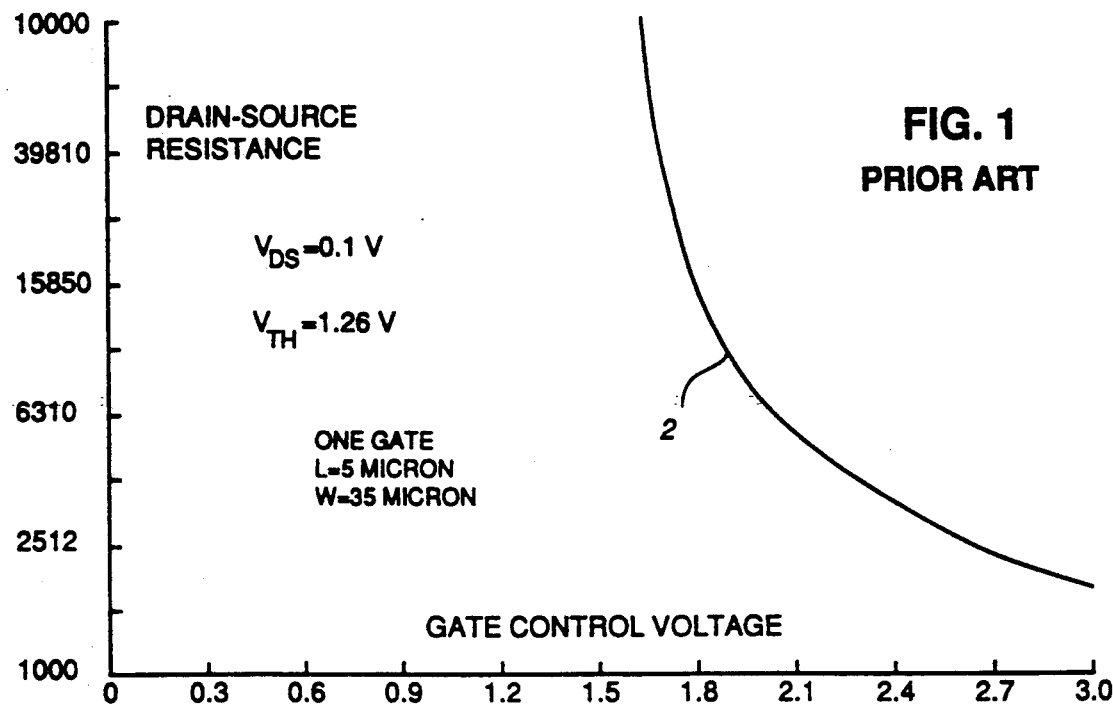

United States Patent [19]

Brown

[11] Patent Number: 5,006,733
[45] Date of Patent: Apr. 9, 1991

[54] FILTER CONTROL CIRCUIT

[75] Inventor: Anthony K. D. Brown, Kanata, Canada

[73] Assignee: Northern Telecom Limited, Montreal, Canada

[21] Appl. No.: 522,020

[22] Filed: May 11, 1990

[51] Int. Cl.⁵ .......................... H03K 5/00; H03K 3/01
[52] U.S. Cl. ..................................... 307/521; 307/491; 307/296.6; 328/167
[58] Field of Search ............... 307/520, 521, 257, 584, 307/296.2, 491, 242, 243, 296.6, 296.8, 359; 328/167

[56] References Cited

U.S. PATENT DOCUMENTS

| 3,604,947 | 9/1971 | Puthuff | 307/521 |
| 4,263,519 | 4/1981 | Schade, Jr. | 307/296.6 |
| 4,509,019 | 4/1985 | Banu et al. | 330/107 |
| 4,918,338 | 4/1990 | Wong | 307/521 |

OTHER PUBLICATIONS

"On-Chip Automatic Tuning for CMOS Continuous Time Filter", M. Banu et al., Digest, IEEE 1985 International Solid-State Circuit Conference, New York.
"Design of MOS VLSI Circuits for Telecommunications", Y. Tsividis et al., Prentice Hall, N.J., p. 348.

Primary Examiner—Stanley D. Miller
Assistant Examiner—Toan Tran
Attorney, Agent, or Firm—Dallas F. Smith

[57] ABSTRACT

A filter control circuit uses a compound FET as a resistance element. The compound FET includes parallel FETs having different gate widths to provide different drain-source resistance characteristics, which overlap to provide an extended operating region, that approaches a linear curve for the combined resistance characteristic. The control voltage used to control the compound FET may be coupled to like compound FETs in the filter being controlled.

13 Claims, 4 Drawing Sheets

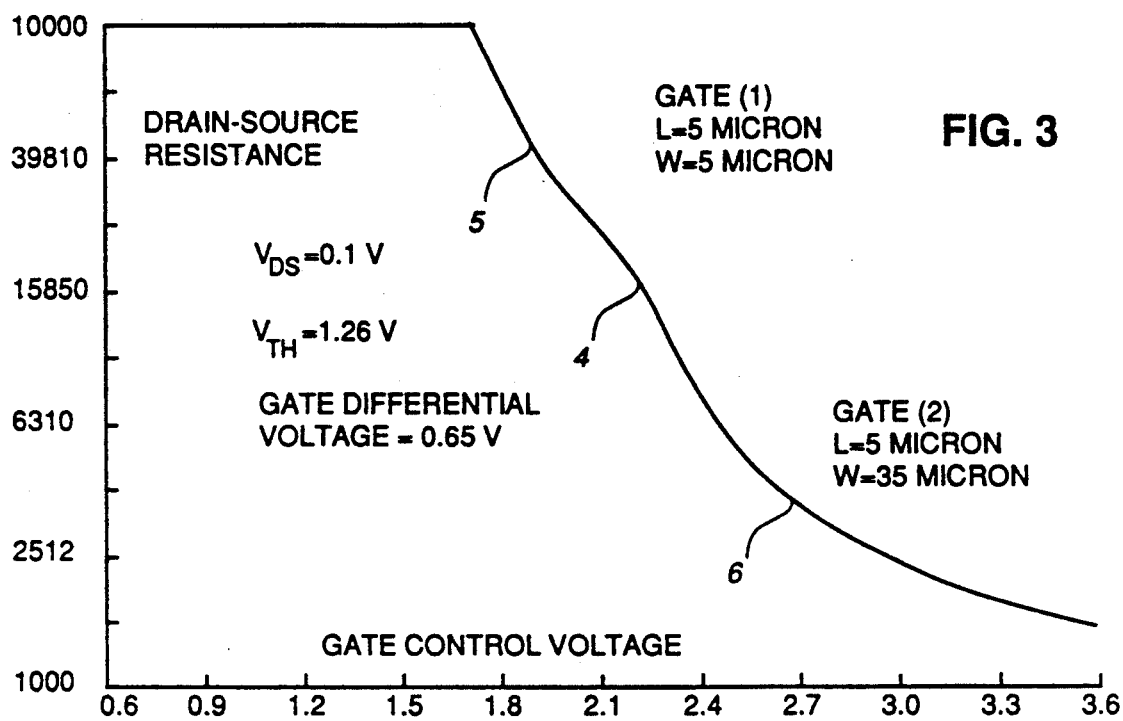
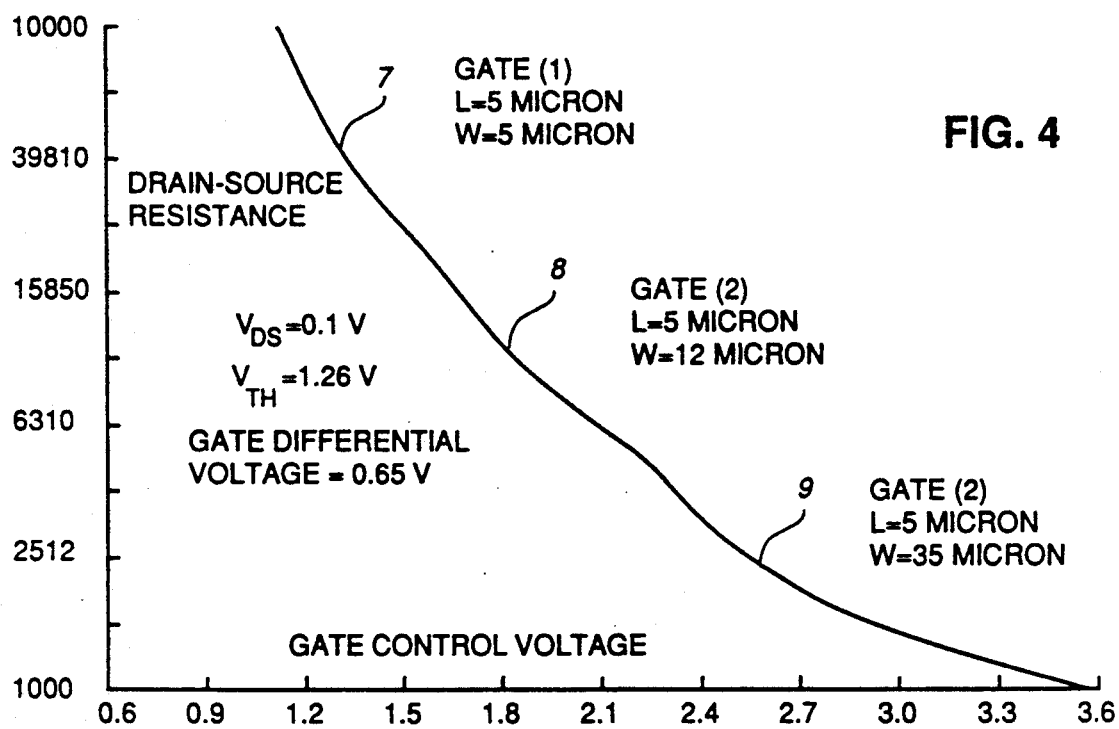

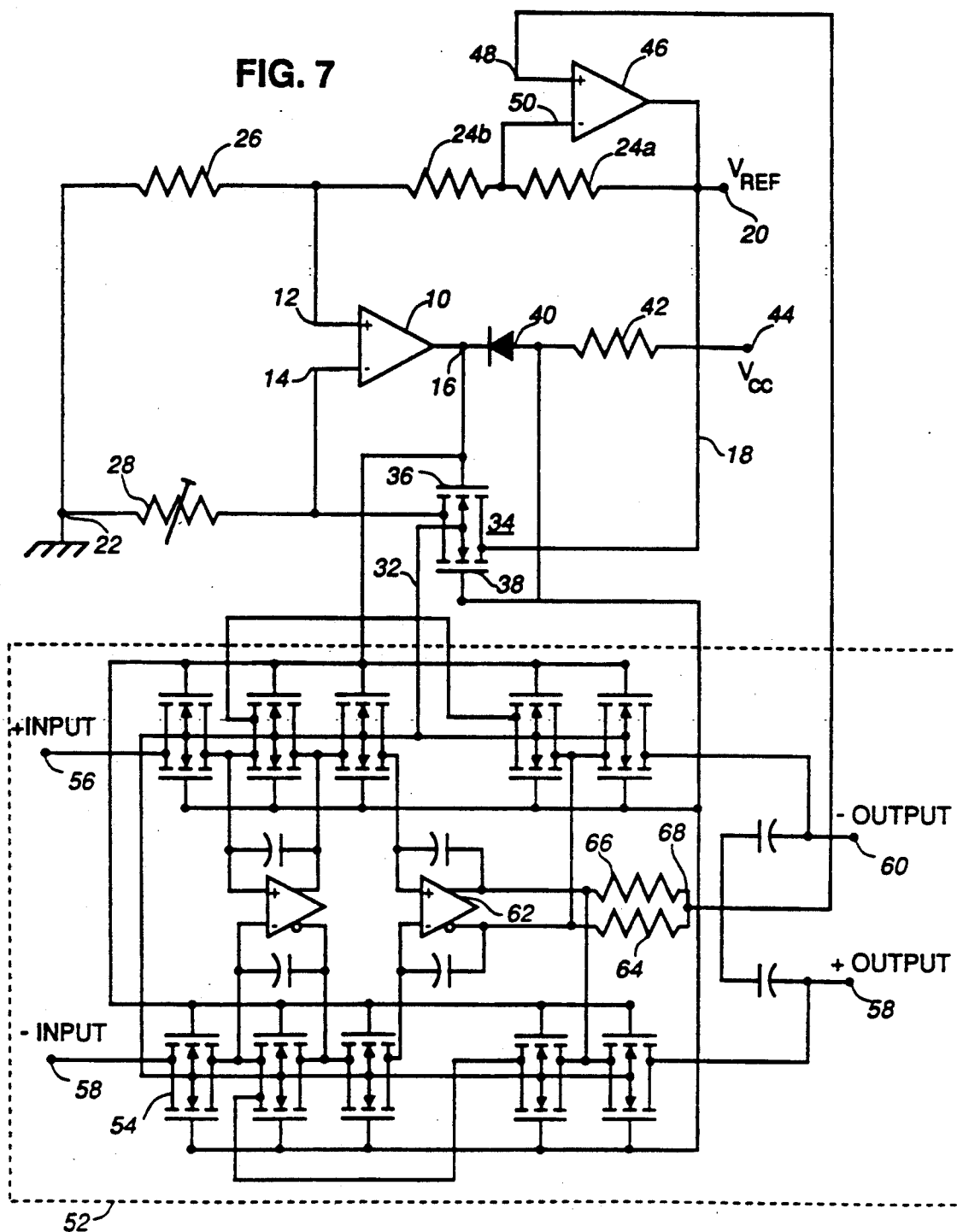

FILTER CONTROL CIRCUIT

This invention relates to integrated analog filters and is particularly concerned with circuits for controlling such filters.

Fully integrated analog filters are well known. Integration of filter resistor and capacitor elements for precision analog filters has been facilitated by the use of MOS field effect transistors as adjustable resistive elements for accurate calibration of the filters, as taught by M. Banu et al. in U.S. Pat. No. 4,509,019, issued Apr. 2, 1985 to AT&T Bell Laboratories. Methods have also been devised for automatically calibrating such filters by using a servo feedback loop which compares the filter pole frequencies to a reference precision oscillator as taught by M. Banu et al. in "On-chip Automatic Tuning for CMOS Continuous Time Filter", Digest, IEEE 1985 International Solid-State Circuit Conference, New York. Alternatively, calibration of the filter frequency may be accomplished by using an external reference resistor. Both methods may be limited in the range of frequency adjustment which is obtainable due largely to the limited controllable range of adjustment of the FET transistors.

An object of the present invention is to provide an improved filter control circuit.

In accordance with the present invention there is provided a filter control circuit, comprising: a resistance bridge circuit having first, second, third and fourth resistance arms, a first junction point between the second and fourth resistance arms, a second junction point between the first and third resistance arms; a third junction point between the first and second resistance arms, and a fourth junction point between the third and fourth resistance arms; comparator means having a first input connected to the third junction point and a second input coupled to the fourth junction point and an output; the fourth resistance arm including field effect transistor means having a plurality of gates connected to the output of the comparator means, each gate having a width different from each other gate.

In an embodiment of the present invention a filter control circuit further comprises a second comparator means having first and second inputs and an output, the first input for an operating point from a filter being controlled and the output connected to the first junction point, wherein the second resistance arm includes a pair of resistors having a junction therebetween, the junction connected to the second input of the second comparator means.

In the intended application as a low pass filter to be functionally trimmed to a particular frequency characteristic, trimming is accomplished by means of functional trimming of an external thick film reference resistor 28.

An advantage of the present invention is that all processing variations of FET characteristics and on-chip capacitors are eliminated by the single functional trim, and temperature variations of the filter performance are primarily due to on-chip capacitance variation and thick film resistor stability.

Figure 2:
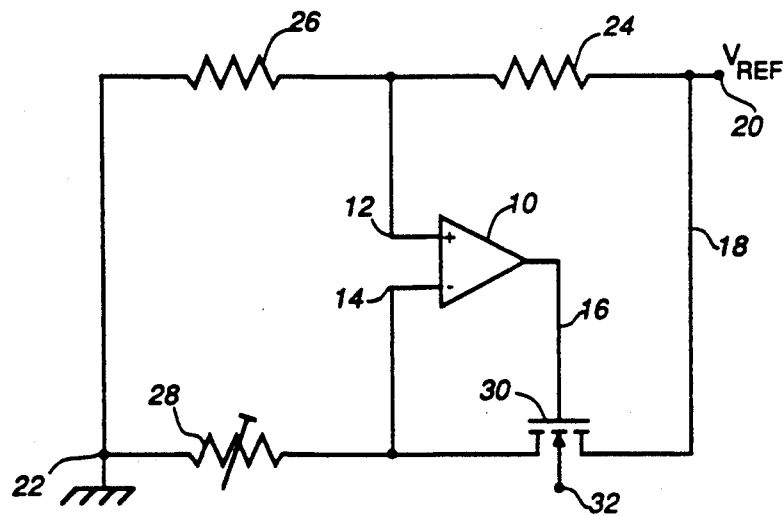
Figure 5:
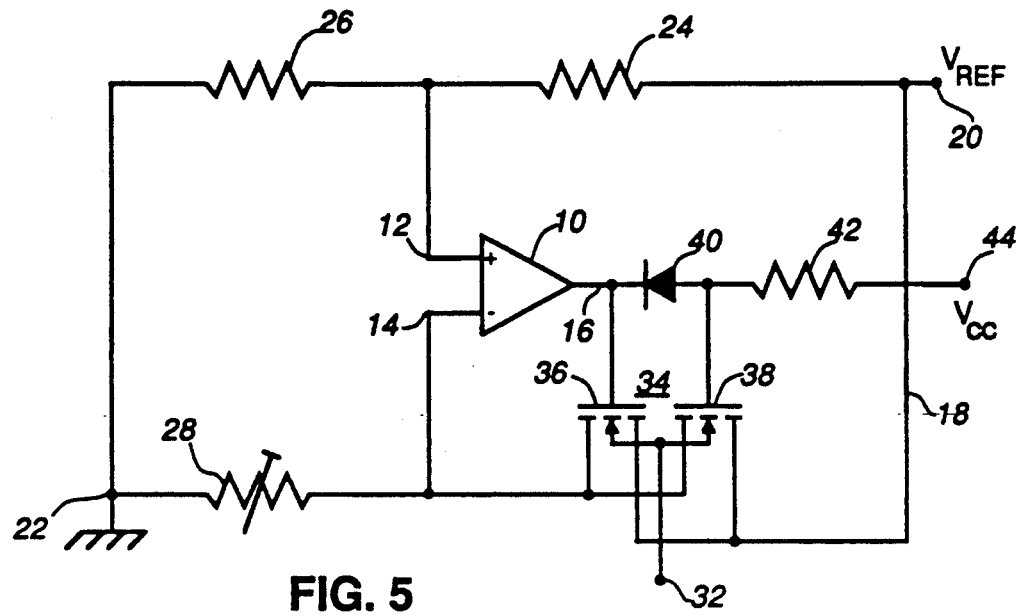
Figure 6:
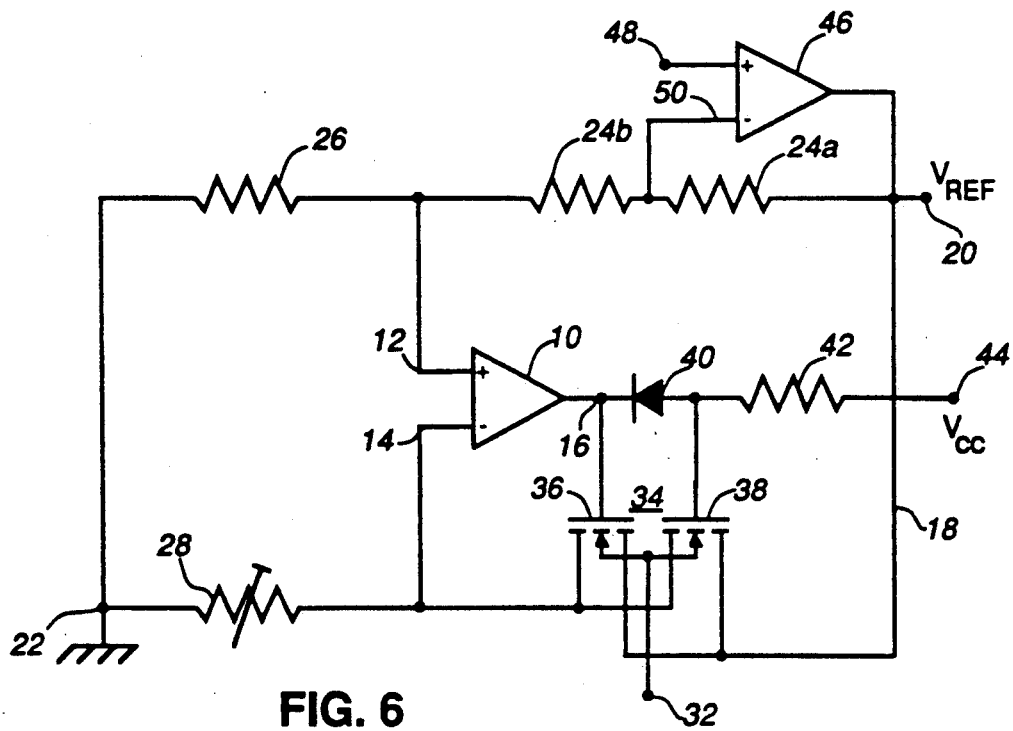

The present invention will be further understood from the following description with reference to the drawings in which:

FIG. 1 graphically illustrates a drain-source resistance characteristic as a function of gate control voltage for an N-channel FET;

FIG. 2 schematically illustrates a known FET filter control circuit;

FIG. 3 graphically illustrates a drain-source resistance characteristic as a function of gate control voltage for a dual compound FET in accordance with an embodiment of the present invention;

FIG. 4 graphically illustrates a drain-source resistance characteristic as a function of gate control voltage for a triple compound FET in accordance with an embodiment of the present invention;

FIG. 5 schematically illustrates a filter control circuit in accordance with a first embodiment of the present invention;

FIG. 6 schematically illustrates a filter control circuit in accordance with a second embodiment of the present invention; and FIG. 7 schematically illustrates the filter control circuit of FIG. 6, connected to a Tow-Thomas Biquad filter for control thereof.

Similar references are used in different figures to denote similar components.

Field effect transistors have the potential of being adjusted over a very wide range of drain to source resistance. In applications such as analog filter design, the FET is designed to have a relatively long channel length to avoid short channel effects and to facilitate matching of FET characteristics in filters requiring such matching. As the FET is employed as a resistive element, it is operated well below saturation by maintaining a drain to source potential of less than 0.2 volts typically. To further improve linearity of the device, some degree of reverse back gate bias is often used. The reverse back gate bias also increases the threshold voltage of the FET. Thus, when the FET is used as a resistive element, for small excursions of the drain source potentials, the drain-source resistance remains relatively constant.

The use of complementary circuits, such as the Tow-Thomas Biquad, have been shown to reduce nonlinear distortion to a negligible level as taught by Y. Tsividis and P. Antognetti in "Design of MOS VLSI Circuits for Telecommunications", Prentice Hall, N.J., page 348. However, FETs used in such circuits are limited in practical range of adjustment as resistive control elements.

There are two reasons for this limitation. The minimum resistance achievable by a particular FET is determined by its process characteristics and particular physical dimensions, assuming an unrestricted control of the gate voltage. However, in the context of an integrated filter the maximum gate voltage, and therefore minimum resistance, may be limited by the available supply voltages. The maximum resistance which may be practicably achieved with a given FET is set by the requirement to match FETs accurately as resistance elements for use in filter circuits. The Shickman-Hodges model for MOS transistors in the linear region predicts that the drain-source current within that region is given by:

$$I_{DS} = W_O \times KP(1 + LAMBDA \times V_{DS}) \times (V_{GS} - V_{TH} - V_{DS}/2) V_{DS}/L_O \text{ and }$$
$$V_{GS} > V_{TH}$$

where, $I_{DS}$ is the drain to source current; $W_O$ and $L_O$ are the channel width and length, respectively; KP is the transconductance parameter; LAMBDA is the channel modulation factor one; $V_{DS}$ is the drain to source voltage; $V_{GS}$ is the gate to source voltage; and $V_{TH}$ is the threshold voltage. This simple model shows that drain current is linearly proportional to the term $(V_{DS}-V_{TH}V_{DS}/2)$, so that as $V_{GS}$ approaches $(V_{TH}-V_{DS}/2)$, the drain current approaches zero. With a constant drain voltage, the drain resistance to gate voltage characteristic therefore appears hyperbolic. Referring to FIG. 1, there is graphically illustrated a typical drain to source resistance versus gate voltage characteristic 2 for an N-channel FET. As the gate voltage decreases the FET resistance increases nonlinearly. For higher resistances, a relatively small variation of gate potential causes a relatively large change in resistance. As a result, accurate matching of FET transistors can be made for use over a limited range of gate control voltages, hence for a limited range of resistances.

A known filter control circuit is schematically illustrated in FIG. 2. The filter control circuit includes an operational amplifier 10 and a resistance bridge circuit 18. The operational amplifier 10 has a noninverting input 12 and an inverting input 14 and an output 16. The resistance bridge circuit 18 includes reference voltage connection 20, ground connection 22, and resistors 24 and 26 serially connected therebetween. The resistance bridge circuit 18 also includes a trimmable reference resistor 28 and an N-channel FET 30 serially connected via the source-drain path of the N-channel FET between the reference voltage connection 20 and the ground connection 22. The noninverting input 12 is connected to the bridge circuit 18 at a junction between the resistors 24 and 26. The inverting input 14 is connected to the bridge circuit 18 at a junction between the trimmable reference resistor 28 and the N-channel FET 30. The output 16 is connected to the gate of the N-channel FET 30.

In operation, the operational amplifier 10 compares the resistance of the N-channel FET 30 with the trimmable reference resistor 28 in the bridge circuit 18 and applies its output to the gate of the N-channel FET 30 to control its gate potential. The filter control circuit performs as a negative feedback loop which adjusts the gate potential to control the resistance of the FET 30 until the bridge circuit 18 is balanced. When balance is achieved the resistance of FET 30 is given by the equation: $R_{FET}=R_{REF}(R_1/R_2)$. The gate control voltage is then used as the gate voltage of other FETs in a filter circuit to be controlled. Satisfactory operation of the filter typically requires that the FETs in the filter be matched and that the source and drain potentials of all the FETs be approximately the same. Thus, the FETS must have the same DC operating point and AC signal excursions must be small. In practice a small error exists at the input of the amplifier which is:

ERROR = $V_{offset}+(V_{gate}-V_{ref})$/Amplifier gain, where $V_{offset}$ is the input offset voltage of the amplifier when its output voltage $V_{gate}$ is equal to $V_{ref}$.

In accordance with the present invention the source and drain of two or more FETs are connected to form parallel resistive elements, each FET having different, but accurately controlled, gate widths. The resistance characteristic of the parallel combination of FET resistive elements is a result of overlapping the characteristics of the individual FET resistive elements. By arranging for the control gate voltage of narrower gate FET(s) to be higher than that of wider gate FET(s) by a fixed amount, a desired characteristic can be obtained that exhibits an expansion of the controllable range of resistance. The resultant characteristic is graphically illustrated in FIG. 3 for two FETs and FIG. 4 for three FETs. Both FIGS. 3 and 4 show the expansion of the controllable range of resistance compared with that of the single FET of FIG. 1. A suitable amount by which to separate the gate voltages is for example, about one-half the threshold voltage $V_{TH}$.

In FIG. 3, the drain-source resistance versus gate control voltage characteristic 4 comprises two parts. A first part 5, attributable to a first gate and a second part 6 attributable to a second gate. The first gate has a width of about 5 microns and a length of about 5 microns. The second gate has a width of about 35 microns and a length of about 5 microns.

In FIG. 4, the drain-source resistance versus gate control voltage characteristic comprises three parts. A first part 7, attributable to a first gate and a second part 8, attributable to a second gate, and a third part 9, attributable to a third gate. The first gate has a width of about 5 microns and a length of about 5 microns. The second gate has a width of about 12 microns and a length of about 5 microns. The third gate has a width of about 35 microns and a length of about 5 microns.

In operation, the relatively wider gate and lower resistance FET approaches cut-off and its uncontrollable high resistance range as a relatively smaller gate and higher resistance FET becomes dominant. The two FET combination, whose characteristic is shown in FIG. 3, can provide practical resistor ranges of more than 64:1.

Referring to FIG. 5, there is illustrated a filter control circuit in accordance with a first embodiment of the present invention. The single N-channel FET 30 of the prior art circuit of FIG. 2 is replaced by a compound FET 34. The compound FET 34 includes a FET 36 having a relatively wider gate and a FET 38 having a relatively narrower gate. The operational amplifier 10 has its output 16 connected to the gate of the FET 36. A diode 40, forward biased by serial connection via a pull-up resistor 42 to a supply voltage terminal 44, is connected between the gates of FET 38 and FET 36.

In operation, as with the single FET control circuit of FIG. 2, the operational amplifier 10 provides negative feedback to enable the balancing of the bridge circuit 18. As described with regard to FIGS. 3 and 4, the gate of the narrower gate, higher resistance FET 38 is held at a potential which is a fixed amount above the gate potential of the wider gate FET 36 by the forward biased diode 40. The gate potentials controlling the compound FET may be used to control other similar compound FET structures in the filter and thereby exhibit matching resistance characteristics. As for the case of the single FET control circuit, satisfactory operation of the filter typically requires operating points of the compound FETs to be approximately the same as the compound FET 34, AC signal levels to be small compared to the gate and back gate bias levels and DC operating points of the sources and drains to be the same for each FET.

A further requirement of a control circuit may be to operate the reference compound FET 34 at the operating point of the compound FETs used in the active filter. The embodiment schematically illustrated in FIG. 6 provides for this requirement. The filter control circuit of FIG. 6 is modified with the addition of an operational amplifier 46. The operational amplifier 46 has a noninverting input 48 for connection to a potential equivalent to the operating point of the filter and inverting input 50 connected to a junction between resistors 26a and 26b that provides the mean of the drain and source potentials of the compound FET 34. Thus, the compound FET is biased so that the mid-point of drain to source resistance occurs at the same potential as the operating point of the compound FETs used in the filter.

FIG. 7 schematically illustrates an application of the embodiment of FIG. 6. The filter topology consists of the well known Tow-Thomas Biquad 52 coupled to a single pole passive RC network having inputs, positive 56 and negative 58, and outputs, positive 58 and negative 60. The filter includes dual compound FETs, which for simplicity, are indicated collectively in FIG. 7 as FET 54. The dual compound FETs 54 are all similar to the reference FET 34 of the control circuit. All resistive elements in the filter are dual compound FETs which are adjustable over a range of 100:1. The adjustment of the reference FET is achieved with an error of less than 1.5 percent. This error is due largely to the finite gain of the operational amplifiers. The voltage drop across the compound FET is approximately 0.2 volts, so that in practice offset voltages of the operational amplifier would be expected to contribute up to 1.5 percent additional error with this circuit. Matching of the filter FET resistances 54 to the reference FET 34 resistance can be obtained with less than 0.3 percent error.

As discussed with respect to FIG. 6, the reference compound FET 34 may be required to operate at the operating point of the filter. In the circuit of FIG. 7, this is accomplished by having the input 48 of the operational amplifier 46 connected to an output operational amplifier 62 of the filter 52 via resistors 64 and 66 at a junction point 68. The resistors 64 and 66 sum respective inverting and noninverting outputs of the operational amplifier 62 to provide the operating point of the filter 52 at the junction point 68.

The intended application is a low pass filter to be functionally trimmed to a particular frequency characteristic by means of functional trimming of an external thick film reference resistor 28. All processing variations of FET characteristics and on-chip capacitors are eliminated by the single functional trim and temperature variations of the filter performance are very small, being primarily due to on-chip capacitance variation and thick film resistor stability. The result is a very stable filter capable of being trimmed to a wide range of frequencies. Allowing for broad process variations of the FET characteristics of ±100% and on-chip capacitance variations of ±30%, a practical tunable range for this filter is a decade of frequency.

Numerous modifications, variations and adaptations may be made to the particular embodiments of the invention described above without departing from the scope of the invention, which is defined in the claims.

What is claimed is:

1. A filter control circuit, comprising:
a resistance bridge circuit having first, second, third and fourth resistance arms, a first junction point between the second and fourth resistance arms, a second junction point between the first and third resistance arms, a third junction point between the first and second resistance arms, and a fourth junction point between the third and fourth resistance arms;
comparator means having a first input connected to the third junction point and a second input coupled to the fourth junction point and an output;
the fourth resistance arm including field effect transistor means having a plurality of gates connected to the output of the comparator means, each gate having a width different from each other gate.

2. A filter control circuit as claimed in claim 1 wherein the field effect transistor means comprises a plurality of field effect transistors connected in parallel between their drain and source terminals.

3. A filter control circuit as claimed in claim 2 wherein voltage offset means are connected between each gate for providing an offset voltage therebetween and the gates are connected in order of relative gate width.

4. A filter control circuit as claimed in claim 1 wherein the field effect transistor means comprises a compound field-effect transistor including a plurality of field effect transistors connected in parallel between their drain and source terminals.

5. A filter control circuit as claimed in claim 4 wherein voltage offset means are connected between each gate for providing an offset voltage therebetween and the gates are connected in order of relative gate width.

6. A filter control circuit as claimed in claim 3 wherein the voltage offset means include a forward biased diode.

7. A filter control circuit as claimed in claim 1 further comprising a second comparator means having first and second inputs and an output, the first input for an operating point from a filter being controlled and the output connected to the first junction point, wherein the second resistance arm includes a pair of resistors having a junction therebetween, the junction connected to the second input of the second comparator means.

8. A filter control circuit as claimed in claim 7 wherein the field effect transistor means comprises a plurality of field effect transistors connected in parallel between their drain and source terminals.

9. A filter control circuit as claimed in claim 8 wherein voltage offset means are connected between each gate for providing an offset voltage therebetween and the gates are connected in order of relative gate width.

10. A filter control circuit as claimed in claim 9 wherein the voltage offset means include a forward biased diode.

11. A filter control circuit as claimed in claim 7 wherein the field effect transistor means comprises a compound field effect transistor including a plurality of field effect transistors connected in parallel between their drain and source terminals.

12. A filter control circuit as claimed in claim 11 wherein voltage offset means are connected between each gate for providing an offset voltage therebetween and the gates are connected in order of relative gate width.

13. A filter control circuit as claimed in claim 12 wherein the voltage offset means include a forward biased diode.

* * * * *

UNITED STATES PATENT AND TRADEMARK OFFICE
CERTIFICATE OF CORRECTION

PATENT NO. : 5,006,733

DATED : 9 April 1991

INVENTOR(S) : Anthony Kevin Dale BROWN

It is certified that error appears in the above-identified patent and that said Letters Patent is hereby corrected as shown below:

In Drawing

In Figure 7, the Tow-Thomas Biquad 52, the polarity of the operational amplifier 62 is reversed.

Signed and Sealed this

Twenty-sixth Day of January, 1993

Attest:

DOUGLAS B. COMER

Attesting Officer

Acting Commissioner of Patents and Trademarks